(12) United States Patent
Saketi et al.

(10) Patent No.: US 10,615,063 B2
(45) Date of Patent: Apr. 7, 2020

(54) VACUUM PICK-UP HEAD FOR SEMICONDUCTOR CHIPS

(71) Applicant: Facebook Technologies, LLC, Menlo Park, CA (US)

(72) Inventors: Pooya Saketi, Cork (IE); William Padraic Henry, Cork (IE)

(73) Assignee: Facebook Technologies, LLC, Menlo Park, CA (US)

( * ) Notice: Subject to any disclaimer, the term of this patent is extended or adjusted under 35 U.S.C. 154(b) by 221 days.

(21) Appl. No.: 15/807,518

(22) Filed: Nov. 8, 2017

(65) Prior Publication Data

US 2019/0139794 A1    May 9, 2019

(51) Int. Cl.
*H01L 21/683* (2006.01)
*H01L 21/67* (2006.01)
*H01L 21/68* (2006.01)
*H01L 25/075* (2006.01)

(52) U.S. Cl.
CPC ........ *H01L 21/67144* (2013.01); *H01L 21/68* (2013.01); *H01L 21/6838* (2013.01); *H01L 25/0753* (2013.01)

(58) Field of Classification Search
CPC ... B23Q 2703/04; B25J 15/06; B25J 15/0616; B25J 15/0625; B25J 15/0683; H01L 21/67144; H01L 21/68; H01L 21/681; H01L 21/682; H01L 21/6838; H01L 25/0753
USPC ........................ 294/183, 186, 188; 414/752.1
See application file for complete search history.

(56) References Cited

U.S. PATENT DOCUMENTS

| | | | |
|---|---|---|---|
| 5,961,169 A | 10/1999 | Kalenian et al. | |
| 6,145,901 A | 11/2000 | Rich | |
| 6,551,048 B1 | 4/2003 | Bayan et al. | |
| 2008/0105128 A1* | 5/2008 | Yang | B25B 11/005 96/113 |
| 2013/0122610 A1 | 5/2013 | Chung et al. | |
| 2016/0086855 A1 | 3/2016 | Bower et al. | |

(Continued)

FOREIGN PATENT DOCUMENTS

| | | |
|---|---|---|
| CN | 107039298 A | 8/2017 |
| WO | WO 2001/086703 A2 | 11/2001 |
| WO | WO 2017/083731 A1 | 5/2017 |

OTHER PUBLICATIONS

Machine Translation of CN107039298A.*

(Continued)

*Primary Examiner* — Saul Rodriguez
*Assistant Examiner* — Brendan P Tighe
(74) *Attorney, Agent, or Firm* — Fenwick & West LLP

(57) ABSTRACT

To manufacture a device by picking and placing semiconductor devices from a carrier substrate to a target substrate using suction force, a subset of pick-up heads of an array of pick-up heads is selectively operated to attach a subset of the semiconductor devices to the subset of pick-up heads by a suction force. The subset of semiconductor devices attached with the pick-up heads are placed over or on a target substrate, and releasing onto the target substrate. The semiconductor devices may be detached from the pick-up heads by releasing or reversing the suction force. The suction force may be created by controllable membranes in the pick-up heads, such as piezoelectric benders.

17 Claims, 12 Drawing Sheets

(56) References Cited

U.S. PATENT DOCUMENTS

2016/0240516 A1    8/2016  Chang
2018/0158706 A1*   6/2018  Hsu ........................ H01L 24/00

OTHER PUBLICATIONS

Extended European Search Report and Written Opinion, European Application No. 18204527.8, dated Apr. 5, 2019, 10 pages.
PCT International Search Report and Written Opinion, PCT Application No. PCT/US2018/057567, dated Feb. 22, 2019, 21 pages.

* cited by examiner

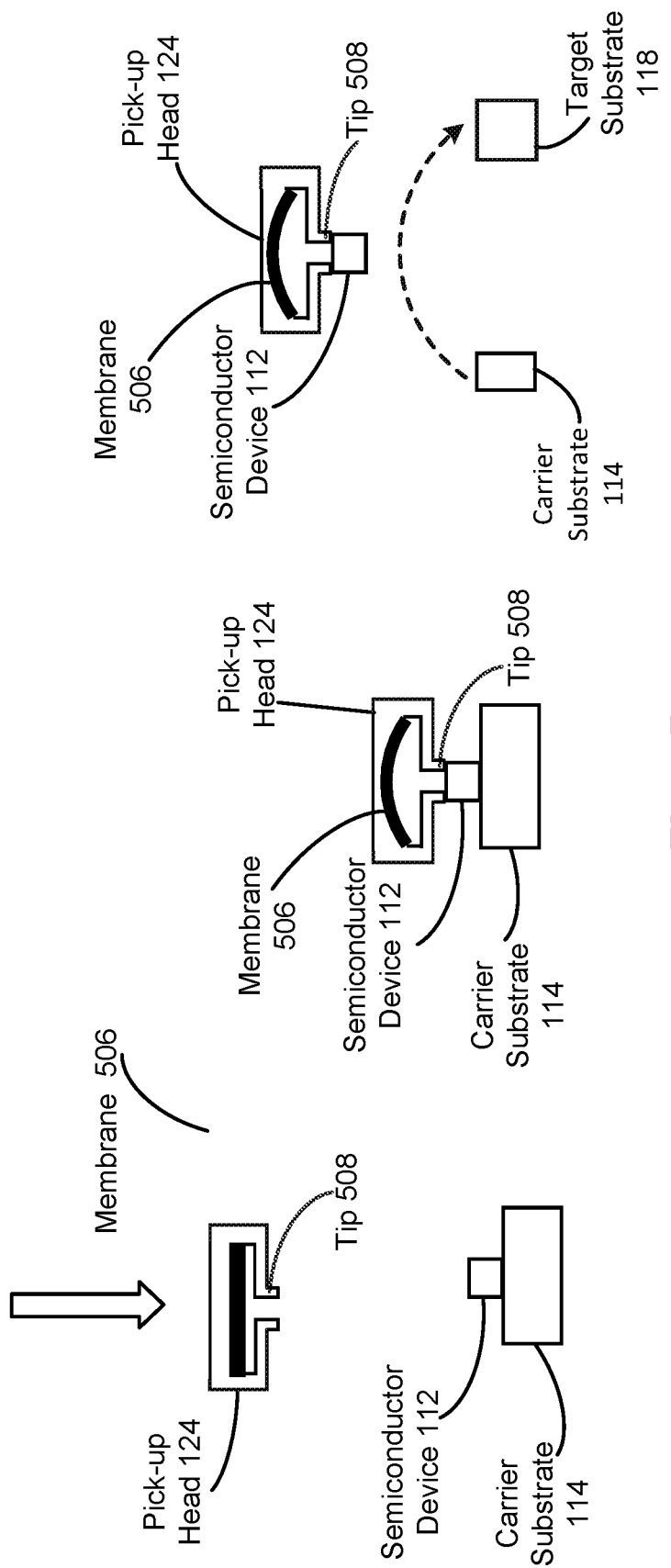

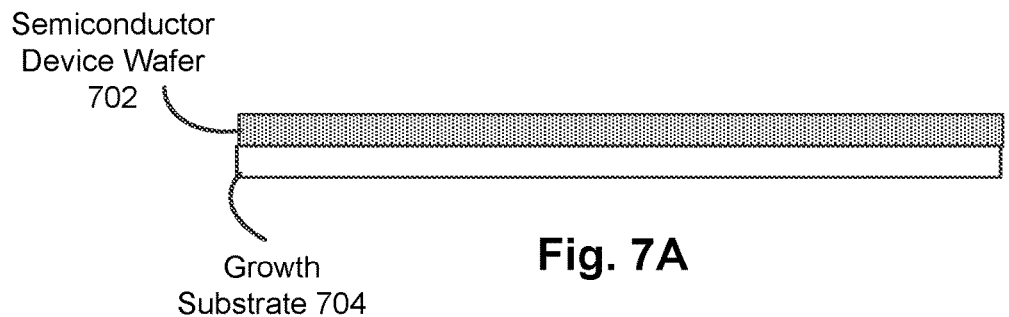
Fig. 7A
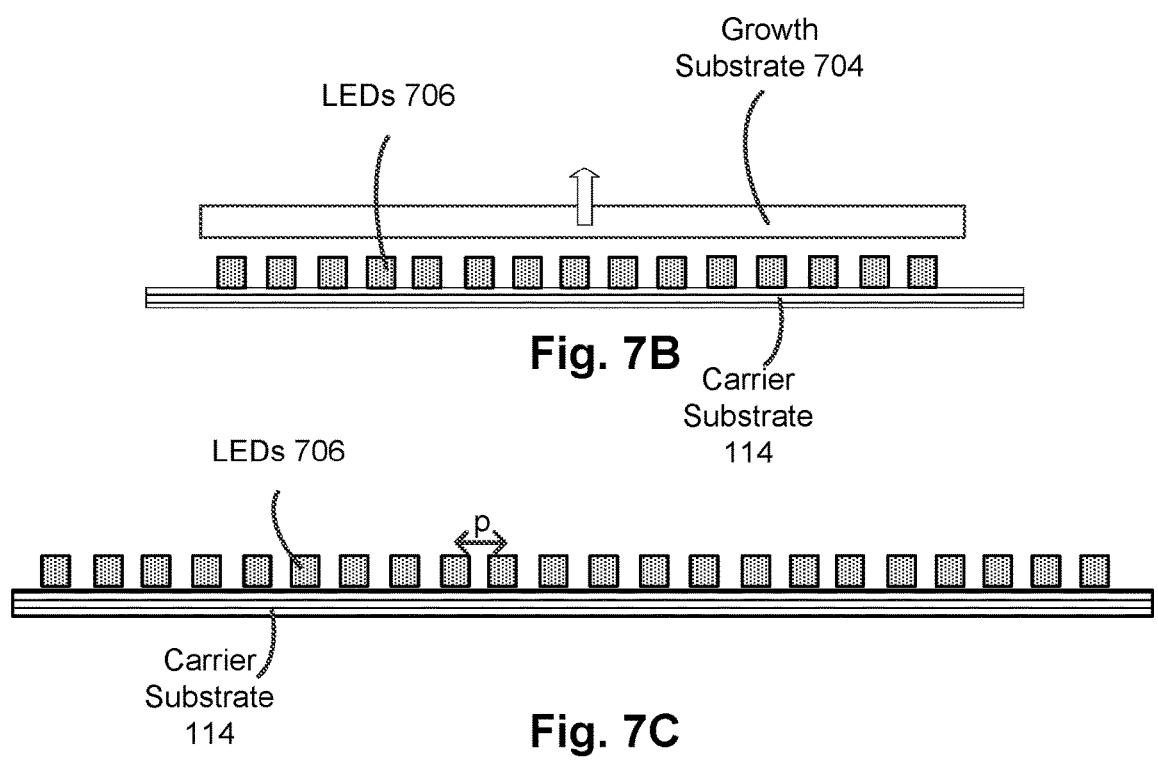
Fig. 7B
Fig. 7C
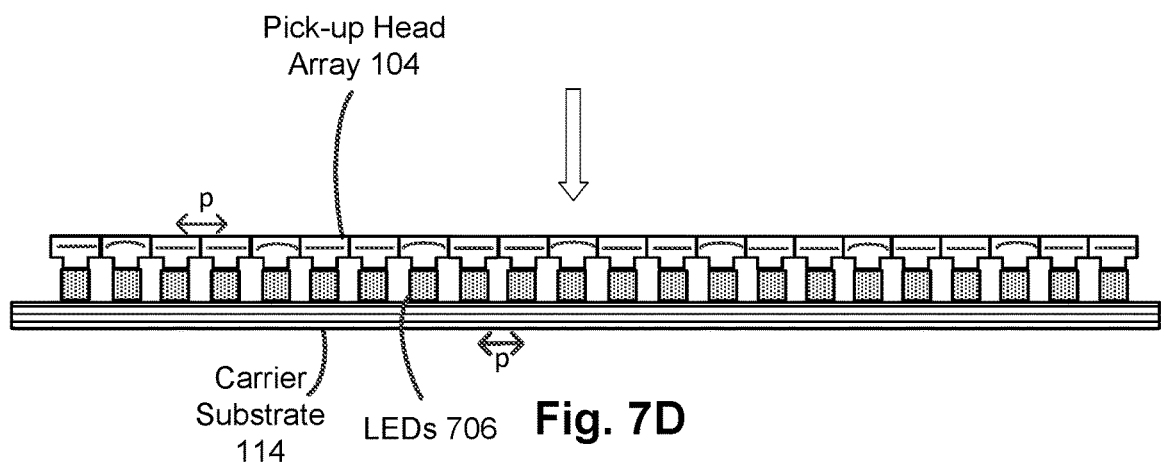
Fig. 7D

VACUUM PICK-UP HEAD FOR SEMICONDUCTOR CHIPS

BACKGROUND

The present disclosure relates to using a vacuum pick-up and transfer process to pick and place of display elements from an initial substrate to a receiving substrate.

To populate a display with very small light emitting diodes (LEDs), such as micro-light emitting diodes (mLEDs) or vertical-cavity surface-emitting lasers (VCSELs), there may be a need to transfer the LEDs from the native substrate on which they have been manufactured to a target substrate that forms part of a display, or "display substrate." Such small semiconductor devices may be assembled with a defined separation distance between them or closely packed together on the target substrate. Because of the small size of these devices (e.g., between 1 $\mu m^2$ and 20 $\mu m^2$), conventional pick and place techniques are unsuitable.

SUMMARY

Embodiments relate to selectively applying suction force as a transfer medium for picking and placing a semiconductor device, such as a micro-LED or a VCSEL. Some embodiments placing an array of pick-up heads over or on semiconductor devices on a carrier substrate, and selectively operating a subset of pick-up heads to attach a subset of the semiconductor devices to the subset of pick-up heads by a suction force responsive to placing the array of pick-up heads over or on the semiconductor devices. The pick-up heads with the semiconductor devices attached are aligned over or on a target substrate. The semiconductor devices are released onto the target substrate when the at least the subset of pick-up heads are over or on the target substrate. The semiconductor devices may be released by releasing or reversing the suction force.

In some embodiments, a membrane such as a piezoelectric bender inside each pick-up head is used to generate the suction force in response to control signals that cause deformation of the piezoelectric bender.

Some embodiments relate to an array of pick-up heads and an actuator. The array of pick-up heads have apertures and are selectively operated to attach a subset of semiconductor devices on a carrier substrate onto the operated pick-up heads by a suction force provide via the apertures. The subset of the semiconductor devices are detached onto a target substrate by releasing the subset of the semiconductor devices from the array of pick-up heads. The actuator is coupled to the array of pick-up heads. The actuator places the array of pick-up heads over or on the semiconductor devices on the carrier substrate, and places place at least the subset of pick-up heads with the subset of semiconductor devices attached over or on the target substrate.

BRIEF DESCRIPTION OF THE DRAWINGS

FIGS. 5A through 5E are schematic diagrams illustrating the picking and placing of a semiconductor device with a pick-up head, in accordance with one embodiment.

FIGS. 7A through 7G are schematic diagrams illustrating the picking and placing of multiple semiconductor devices using pick-up head array, in accordance with one embodiment.

The figures depict embodiments of the present disclosure for purposes of illustration only.

DETAILED DESCRIPTION

Embodiments relate to the picking and placing of semiconductor devices, such as light emitting diodes (LEDs) or VCSELs, using an array of individual pick-up heads that selectively attach to and detach from the semiconductor devices using suction force.

Fabrication System Overview

Figure 1:
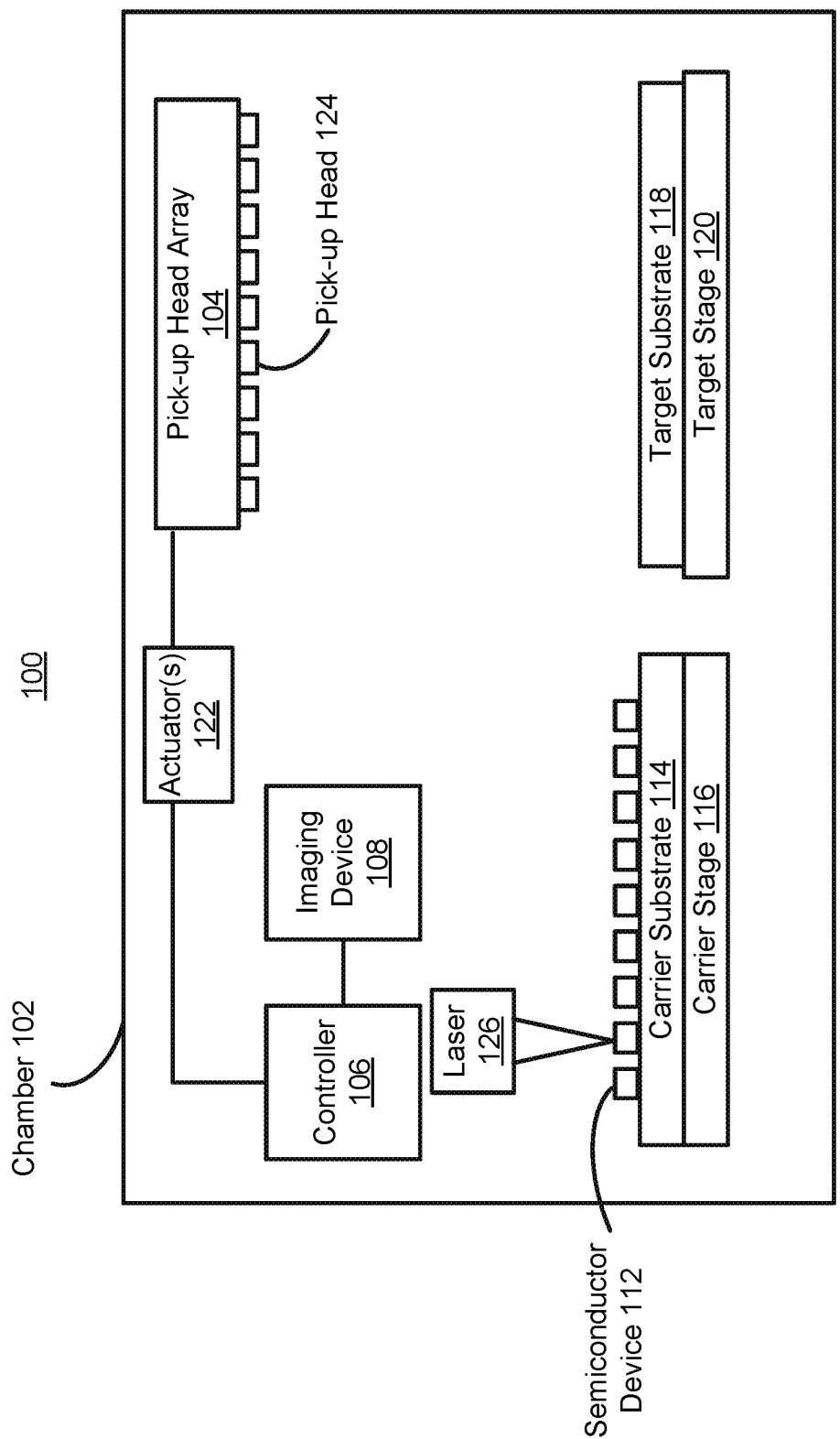
FIG. 1 is schematic diagram illustrating a display fabrication system, in accordance with one embodiment.

FIG. 1 is a block diagram illustrating a display fabrication system 100, in accordance one embodiment. The system 100 fabricates an electronic display by assembling semiconductor devices 112 from a carrier substrate 114 to a target substrate 118. In some embodiments, the semiconductor devices 112 are different color light emitting diode (LED) dies, or individual VCSELs. The carrier substrate 114 holds the semiconductor devices 112 for pick up by the pick-up head array 104. The target substrate 118 may be a display substrate, or may be an intermediate carrier substrate that facilitates bonding with a display substrate. The system 100 places the semiconductor devices 112 at pixel locations of the display substrate, and then bonds the semiconductor devices 112 to the display substrate. In some embodiments, the semiconductor devices 112 are micro-LEDs having a reduced divergence of light output and small light emitting area. In other embodiments, the semiconductor devices are VCSELs. The system 100 provides selective pick and place of semiconductor devices of small size, but can be used to assemble other types of semiconductor devices.

The system 100 may include, among other components, a chamber 102 defining an interior environment for picking and placing semiconductor devices 112 within the chamber 102. The system 100 further includes the pick-up head array 104, an imaging device 108, an actuator 122, a carrier stage 116, a target stage 120, and a laser 126. The carrier stage 116 holds a carrier substrate 114 having semiconductor devices 112. The target stage 120 holds a target substrate 118 to receive some or all of the semiconductor devices 112 from the carrier substrate 114. A controller 106 is coupled to the imaging device 108 and the pick-up head array 104 (e.g., via the actuator 122) and controls the operations of the imaging device 108 and pick-up head array 104. For example, the controller 106 causes the pick-up head array 104 to pick up one or more semiconductor devices 112 located on a carrier substrate 114, and place the one or more semiconductor devices on the target substrate 118.

The pick-up head array 104 includes multiple pick-up heads 124. Each pick-up head 124 can pick up a semiconductor device 112 from the carrier substrate 114, and place the semiconductor device on the target substrate 118. Each pick-up head 124 includes an aperture, and provides a suction force via the aperture to pick up a semiconductor device 112 from the carrier substrate 114. After attaching and picking up a semiconductor device 112 with the suction force, the pick-up head 124 is aligned with a location on the target substrate 118. The pick-up head 124 separates the semiconductor device 112 from the pick-up head 124 and places the semiconductor device 112 at the location on the target substrate 118. Separation from the pick-up head 124 can be achieved by releasing the suction force used for the attachment, or by applying a reverse suction force that pushes the semiconductor device 112 away from the pick-up head 124.

The actuator 122 is an electro-mechanical component that controls the movement of the pick-up head array 104 based on instructions from the controller 106. For example, the actuator 122 may move the pick-up head array 104, or individual pick-up heads 124, with up to six degrees of freedom including up and down, left and right, forward and back, yaw, pitch, and roll. The actuator 122 may be embodied, for example, as a rotating motor, a linear motor or a hydraulic cylinder.

The imaging device 108 facilitates a visual alignment for semiconductor device pick-up from the carrier substrate 114, and alignment for semiconductor device placement on the target substrate 118. For example, the imaging device 108 generates images of the pick-up head array 104 and the carrier substrate 114, and provides the images to the controller 106. In some embodiments, the imaging device is a camera or other optical device. The pick-up head array 104 may include transparent materials (e.g., glass or polydimethylsiloxane (PDMS)) to allow see-through alignment. In some embodiments, the imaging device 108 is an environmental scanning electron microscope (ESEM) to provide images without specimen coating, and the chamber 102 is an ESEM chamber including a high pressure atmosphere of water vapor. In various embodiments, other types of imaging devices may be used to facilitate the alignments. For placement accuracy of larger than 0.5 um, optical systems may be used, while for placement accuracies of smaller than 0.5 um, SEM systems may be used.

The controller 106 controls the operation of the pick-up head array 104. The controller 106 may selectively operate a subset of the pick-up heads 124 to attach a subset of the semiconductor devices 112 to the subset of pick-up heads 124 for a pick and place process. The controller 106 may align pick-up heads 124 of the pick-up head array 104 with the carrier substrate 114 based on the images, and picks up one or more semiconductor devices 112 mounted on the carrier substrate 114. In another example, the imaging device 108 generates images of the one or more pick-up heads 124 of the pick-up head array 104 and the target substrate 118, and provides the images to the controller 106. The controller 106 may align the pick-up heads 124 with the display substrate 118 based on the images, and places the semiconductor devices 112 attached to the pick-up heads 124 on the display substrate 118.

In some embodiments, the carrier stage 116 and/or target stage 120 may be adjusted to facilitate precision alignment with the pick-up head array 104. For example, the carrier stage 116 and/or target stage 120 may include three degrees of freedom. The degrees of freedom may include left and right, backward and forward, and a yaw rotational degree of freedom. The carrier substrate 114 is moved with the carrier stage 116, and the display substrate 118 is moved with the target stage 120.

The system 100 may include one or more carrier substrates 114. For example, different carrier substrates 114 may carry different color LED dies. A carrier substrate 114 holds singulated semiconductor devices 112 for transfer to the display substrate 118. The system may include one or more target substrates 118. In some embodiments, such as when the target substrate 118 is the display substrate for receiving the semiconductor devices 112, the target stage 120 includes a heater for thermal conductive bonding of the electrical contact pads of the semiconductor devices 112 to the display substrate 118 subsequent to placement of the semiconductor devices 112 on the display substrate 118 by the pick-up head 104. In other embodiments, the target substrate 118 is an intermediate carrier substrate that is used to facilitate direct bonding of the semiconductor devices 112 with a separate display substrate 118 (e.g., using a direct bonding process rather than transfer via suction force).

The laser 126 generates a laser beam to perform a laser-lift-off (LLO) process that separates the growth substrate from the epitaxial layer of the semiconductor devices 112. Multiple semiconductor devices 112 may be fabricated on a growth (or "native") substrate and singulated using a (e.g., chemical) etching. After etching, the laser 126 applies a beam that breaks bonds in the epitaxial layer. For example, if the epitaxial layer includes GaN, then the laser may break the bonds between the Ga and N. The N is evaporated and heat may be applied to melt the remaining Ga (e.g., at 30° C.) allowing the substrate to removed. In some embodiments, the growth substrate is a sapphire, glass, or other substrate that is transparent to the light from the laser 126, and the light is applied through the growth substrate for absorption by the epitaxial layer.

In some embodiments, carrier substrate 114 may include a carrier tape or other adhesive layer to hold the semiconductor devices 112 in place with an adhesion force. In some embodiments, an (e.g., $O_2$) plasma etch may be used to reduce the adhesion between the semiconductor devices 112 and the carrier substrate 112. In some embodiments, the adhesion reduction is applied to a subset of the semiconductor devices 112 on the carrier substrate 114 to facilitate pick-up of those devices while ensuring that other non-selected devices remain on the carrier substrate 114.

Figure 2A:
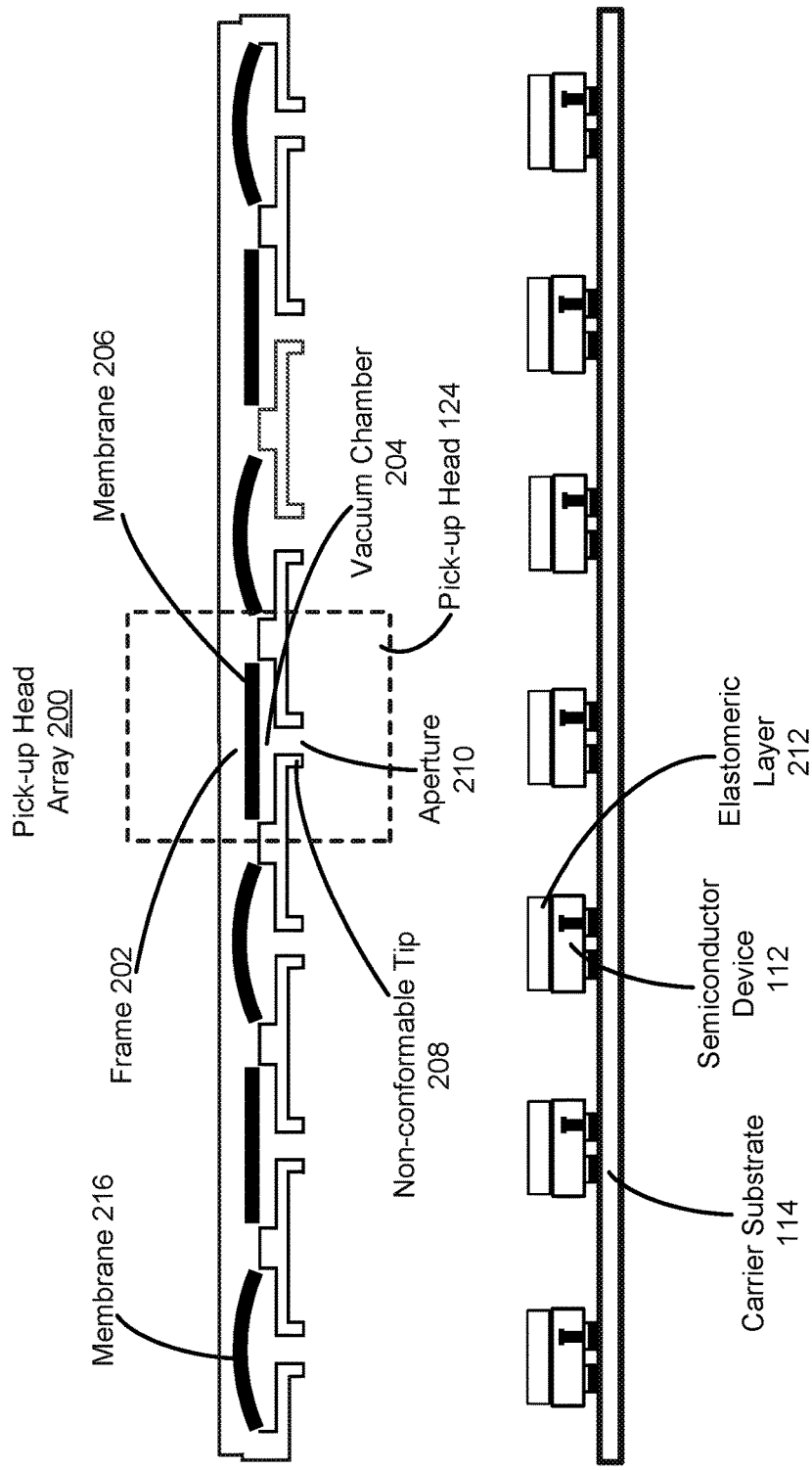
FIG. 2A is a schematic diagram illustrating a pick-up head array of the display fabrication system, in accordance with one embodiment.

FIG. 2A is a schematic diagram illustrating the pick-up head 104, in accordance with one embodiment. The pick-up head array 200, as well as the other pick-up head arrays discussed herein, is an example of the pick-up head array 104 of the system 100. The pick-up head array 200 includes a plurality of pick-up heads 124. Each pick-up head 124 may include an aperture 210. The pick-up heads 124 can be selectively operated to attach some or all of the semiconductor devices 112 on the carrier substrate 114 onto the pick-up heads 124 by a suction force provide via the apertures 210, and detach the semiconductor devices attached to the pick-up heads 124 onto a target substrate 118 by releasing the semiconductor devices from the pick-up head array 200.

Each pick-up head 124 includes a frame 202 defining a vacuum chamber 204, a membrane 206 to change the pressure in the vacuum chamber 204 relative to ambient pressure outside of the vacuum chamber 204, and a non-conformable tip 208 defining an aperture 210 connected to the vacuum chamber 204 to pick up a semiconductor device 112 by the suction force caused by the changing of the pressure in the vacuum chamber 204.

In some embodiments, the membrane 206 may be a piezo bender that deforms, such as by bending, to create the pressure in the vacuum chamber 204 lower than an ambient pressure outside of the vacuum chamber 204. The membrane 206 of each pick-up head 124 may be selectively controlled by a voltage signal from the controller 106. The membrane 206 may be placed in different states to change the pressure in the vacuum chamber 204 to attach and detach semiconductor devices 112 at the tip 208. For example, the membrane 206 is in an unbent state where the pressure in the vacuum chamber 204 is the same or substantially the same as the ambient pressure. When the pick-up head array 104 is placed over or on the semiconductor devices 118 during pick up, selected membranes such as the membrane 216 is placed in a bent state to create a pressure in the vacuum chamber 204 that is lower than the ambient pressure and attach the selected semiconductor devices 118 to pick-up heads 124. As discussed in greater detail in connection with the process 400 in FIG. 4 and shown in FIG. 5D, the membrane 216 may further include another bent state where the membrane 216 creates a pressure in the vacuum chamber 204 that is higher than the ambient pressure to ensure that semiconductor devices 118 selected for detachment are successfully detached.

In some embodiments, the frame 202 is made from an elastomeric material. In some embodiments, the pick-up head array 200 includes a single frame portion that defines the frames 202 of the pick-up heads 124. The pick-up head array 200 may additionally or alternatively include a single tip portion that defines the tips 208 of the pick-up heads 124.

The tip 208 of the pick-up head 124 can be either conformable or non-conformable depending on the interfacing material of the semiconductor device 112. A conformable pick-up head may include a compliant interfacing surface material, while a non-conformable pick-up head may include a solid, non-compliant interfacing surface material. In some embodiments, at least one of the sides of the interface between the semiconductor device 112 and the pick-up head 124 is conformable. In FIG. 2A, the pick-up heads 124 each include a non-conformable tip. The semiconductor devices 112 include an elastomeric layer 212 that is conformable to facilitate attachment of the semiconductor devices 112 with the non-conformable tip 208 via suction force. In some embodiments, the non-conformable tip 208 defines an aperture 210 having an area of at least 1 μm$^2$.

Figure 2B:
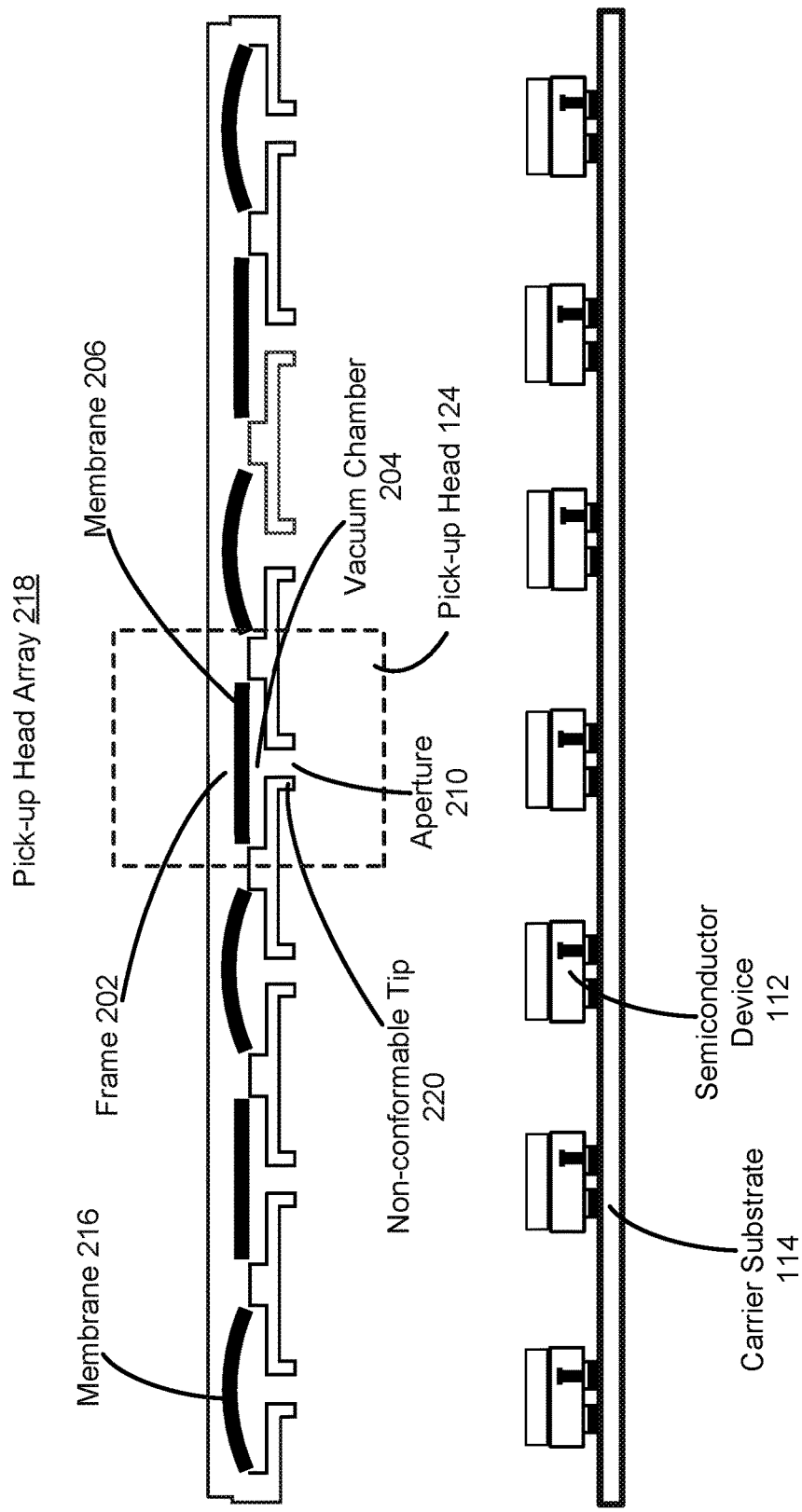
FIG. 2B is a schematic diagram illustrating a pick-up head array of the display fabrication system, in accordance with one embodiment.

FIG. 2B is a schematic diagram illustrating a pick-up head array 218 of the display fabrication system 100, in accordance with one embodiment. Rather than including the non-conformable tip 208 as shown for the pick-up head array 200, the pick-up heads 124 of the pick-up head array 218 include a conformable tip 220. The conformable tip 220 facilitates attachment of the semiconductor devices 112 without the elastomeric layer 212 being formed on the semiconductor devices 112. In some embodiments, the conformable tip 220 defines an aperture 210 having an area of at least 100 nm$^2$. The discussion above regarding the pick-up head array 200 may be applicable to other components of the pick-up head array 218.

Figure 3A:
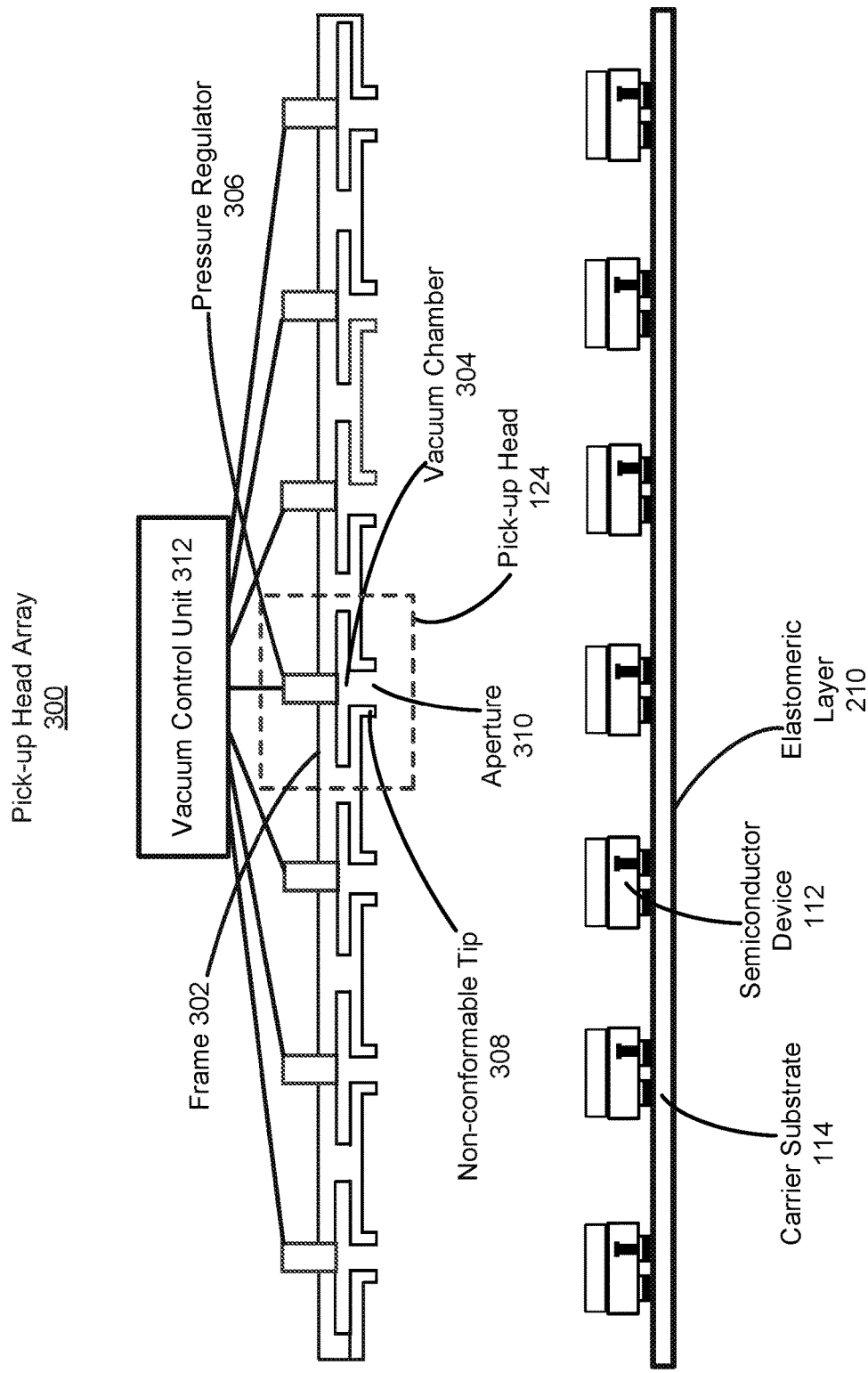
FIG. 3A is a schematic diagram illustrating a pick-up head array of the display fabrication system, in accordance with one embodiment.

FIG. 3A is a schematic diagram illustrating a pick-up head array 300 of the display fabrication system 100, in accordance with one embodiment. Rather than including membranes 206 as discussed above for the pick-up head arrays 200 or 218, the pick-up heads 124 of the pick-up head array 300 include air pressure regulators 306. The pick-up head array 300 includes pick-up heads 124 defining micro-scale vacuum chambers 304, connected to individually addressable micro-channels controlled by the vacuum control unit 312. In some embodiments, the vacuum control unit 312 is integrated with the controller 106. Each pick-up head 124 of the array 300 includes a frame 302 defining a vacuum chamber 304, and the pressure regulator 306 to decrease the pressure in the vacuum chamber 304 relative to ambient pressure outside of the vacuum chamber 304, and a non-conformable tip 308 defining an aperture 310 connected to the vacuum chamber 304 to pick up a semiconductor device 112 by the suction force caused by the changing of the pressure in the vacuum chamber 304. The semiconductor devices 112 include the elastomeric layer 212 that is conformable to facilitate attachment of the semiconductor devices 112 with the non-conformable tip 308 via the suction force. In some embodiments, the frame 302 is made from an elastomeric material.

Figure 3B:
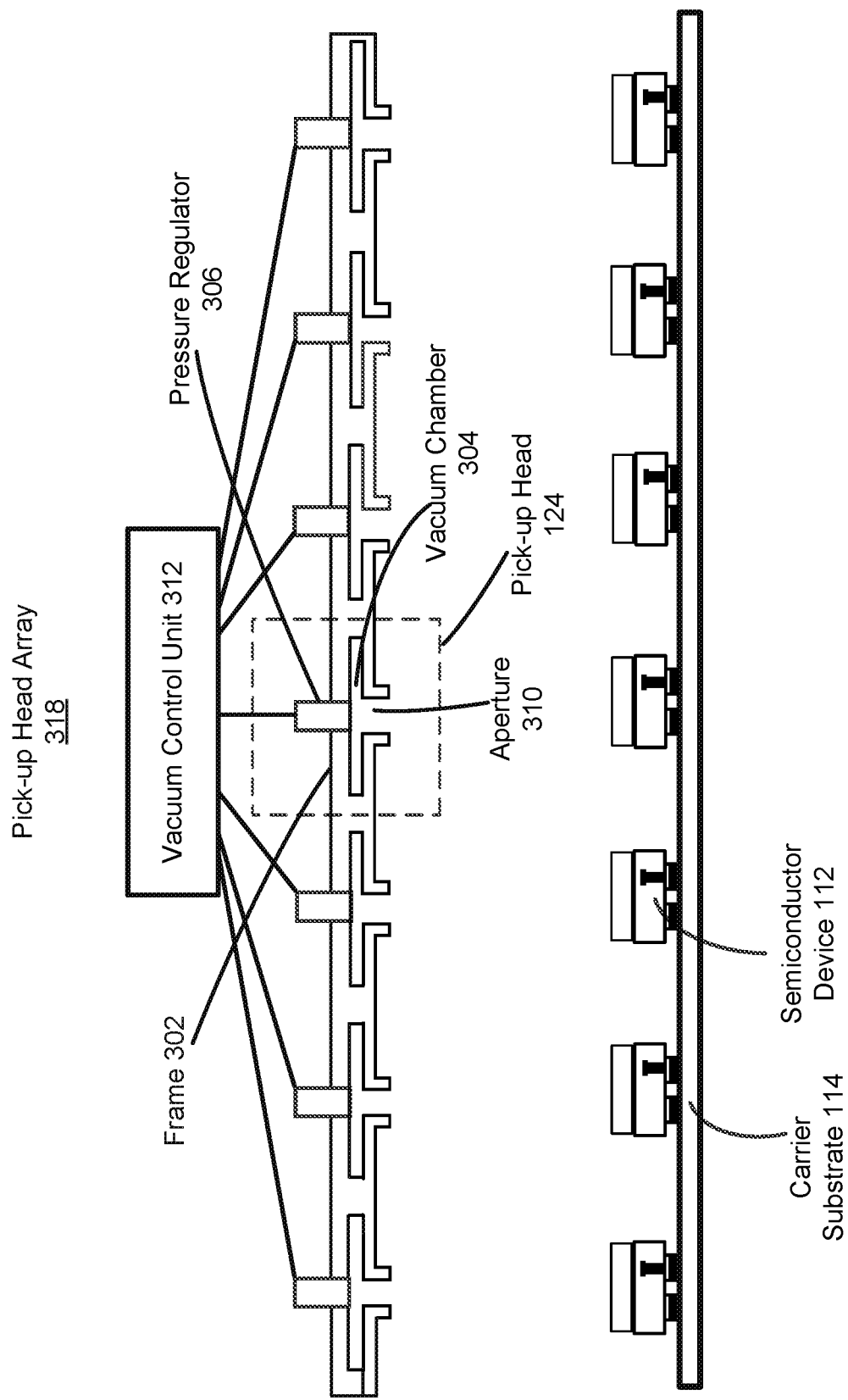
FIG. 3B is a schematic diagram illustrating a pick-up head array of the display fabrication system, in accordance with one embodiment.

FIG. 3B is a schematic diagram illustrating a pick-up head array 318 of the display fabrication system 100, in accordance with one embodiment. Rather than including the non-conformable tip 308 as shown for the pick-up head array 300, the pick-up heads 124 of the pick-up head array 318 include a conformable tip 314. The conformable tip 314 facilitates attachment of the semiconductor devices 112 without the elastomeric layer 212 being formed on the semiconductor devices 112. In some embodiments, the conformable tip 314 defines an aperture 310 having an area of at least 100 nm$^2$. The discussion above regarding the pick-up head array 300 may be applicable to other components of the pick-up head array 318.

Figure 4:
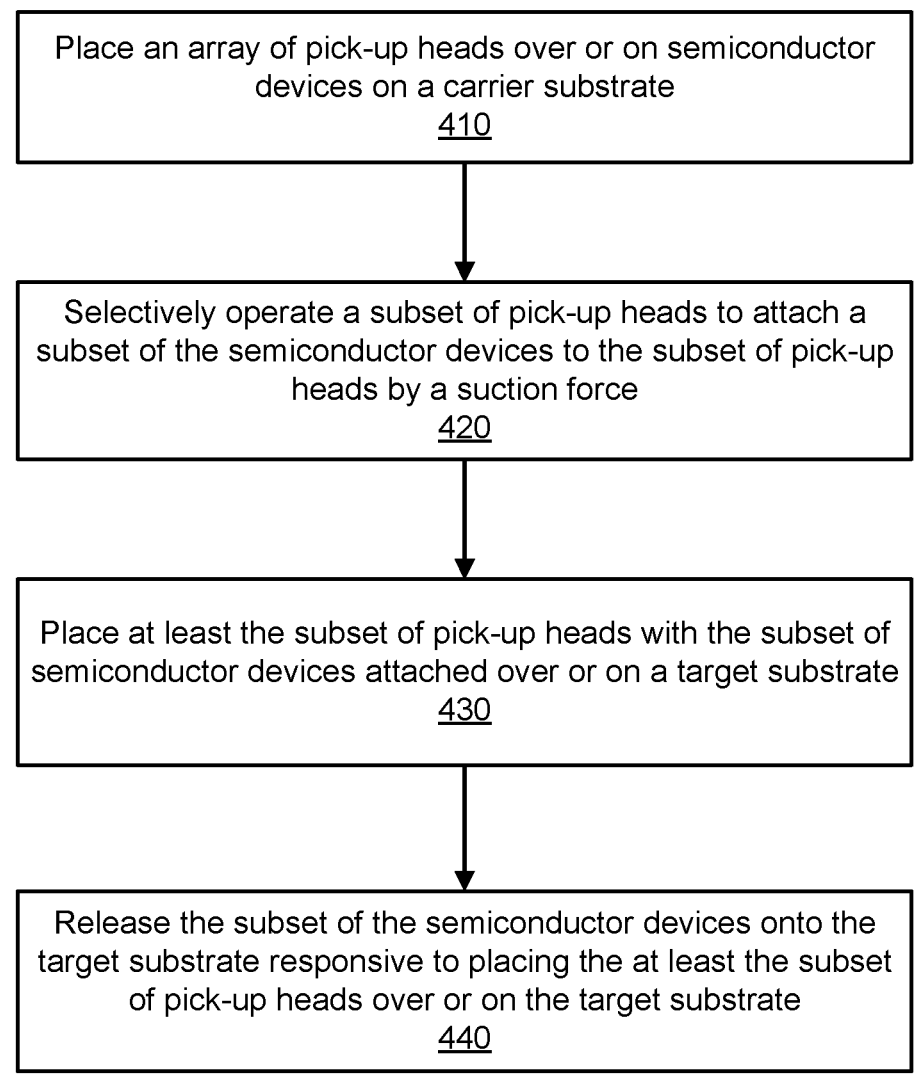
FIG. 4 is a flowchart illustrating a process for picking and placing a semiconductor device with a pick-up head, in accordance with one embodiment.

FIG. 4 is a flowchart illustrating a process 400 for picking and placing a semiconductor devices 112 with a pick-up head array 104, in accordance with one embodiment. Process 400 can be performed by the system 100 to transfer semiconductor devices 112, such as mLEDs or VCSELs, from a carrier substrate 114 to a target substrate 118. Process 400 is discussed with reference to FIGS. 5A, 5B, 5C, 5D and 5E, showing schematic diagrams illustrating the picking and placing of a semiconductor device 112 with the pick-up head 124, in accordance with one embodiment. In some embodiments, the carrier substrate 114 is a carrier film and the target substrate is an intermediate carrier substrate that facilitates placement of semiconductor devices 112 to a target display substrate. In other embodiments, the target substrate 118 is the display substrate, or other final substrate to which the semiconductor devices 112 are placed and bonded.

An array of pick-up heads 124 are placed 410 over or on semiconductor devices 112 on a carrier substrate 114. For example, the controller 106 controls the actuator 122 to align the pick-up heads 124 of the pick-up head array 104 with semiconductor devices 112 on the carrier substrate 114 to pick up selected semiconductor devices 112. In some embodiments, the imaging device 108 generates images as the pick-up head array 104 is placed over or on the semiconductor devices 112 to facilitate the alignment.

The pick-up head array 104 may include a unitary body where each of the pick-up heads 124 move together. In another example, the pick-up head array 104 includes pick-up heads 124 that are controlled individually for pick and place of the semiconductor devices 112.

With reference to FIG. 5A, the tip 508 of the pick-up head 124 is aligned with the semiconductor device 112 on the carrier substrate 114 using the imaging device 108. The membrane 506 may be in the unbent or rest state. Aligning a pick-up head 124 or pick-up head array 104 with the semiconductor device 112 may include manipulating the position of the pick-up head 124 (e.g., movement left or right, and forward or backward) and/or manipulating the position of a stage (e.g., moving the carrier stage 116 or the target stage 120 left or right, backward or forward, or along yaw rotational degree of freedom).

After alignment, the pick-up head 124 is lowered toward the semiconductor device 112 to be over or on the semiconductor device 112. The tip 508 may be placed in close proximity to the semiconductor device 112 without contacting the semiconductor device 112, or may contact the semiconductor device.

A subset of the pick-up heads 124 is selectively operated 420 to attach a subset of the semiconductor devices 112 to the subset of pick-up heads 124 by a suction force responsive to placing the array of pick-up heads 124 over or on the semiconductor devices 112. For example, the controller 106 sends a control signal to selected membranes 206 of the pick-up head array 200 or 218 that causes the pick-up heads 124 to create the pressure in the vacuum chamber 204 that is lower than an ambient pressure outside of the vacuum chamber 204. Some or all of the semiconductor devices 112 may be selected for pick up. In another example, the controller 106 sends a control signal to selected pressure regulators 306 of the pick-up head array 300 or 318 to create the pressure in the vacuum chamber 304 that is lower than the ambient pressure outside of the vacuum chamber 304.

With reference to FIG. 5B, the membrane 506 is placed in a bent state that causes the pressure in the vacuum chamber of the pick-up head 124 to be lower than the ambient pressure outside of the vacuum chamber. This results in a suction force being applied to the semiconductor device 112 that causes attachment of the semiconductor device 112 with the tip 508 of the pick-up head 124.

The pick-up heads 124 with the subset of semiconductor devices 112 attached are placed 430 over or on a target substrate 118. The pick-up heads 124 with the semiconductor devices 112 are lifted from the carrier substrate 114, and place over or on the target substrate 118 using the actuator 122. In some embodiments, the imaging device 108 generates images as the pick-up head array 104 is placed over or on the target substrate 118 to facilitate the alignment. With reference to FIG. 5C, the pick-up head 124 is lifted away from the carrier substrate 114 with the attached semiconductor device 112 and placed over or on the target substrate 118.

The subset of the semiconductor devices 112 are released 430 onto the target substrate 118 responsive to placing the pick-up heads over or on the target substrate 118. With reference to FIG. 5D, the semiconductor device 112 is placed at a target location 510, and then separated from the tip 508 of the pick-up head 124. By controlling either a membrane or pressure unit, the pick-up head 124 may reverse the low pressure condition used for pick up, or create a high pressure condition in the vacuum chamber relative to ambient pressure, to release the semiconductor device 112. In some embodiments, the membrane 506 is placed in a second bent state to create a pressure in the vacuum chamber 204 that is higher than the ambient pressure to detach the semiconductor device 112, as shown in FIG. 5D. The membrane 506 bends in different directions to achieve low and high pressure conditions, which may be controlled by applying either positive or negative biased voltage to the membrane 206. In other embodiments, the membrane 506 reverses the low pressure in the vacuum chamber to the ambient pressure or substantially the ambient pressure by unbending the membrane 506 to the unbent state. Here, the voltage level applied to the membrane 206 during pick up is no longer applied to cause transition to the unbent state.

Figure 5E:
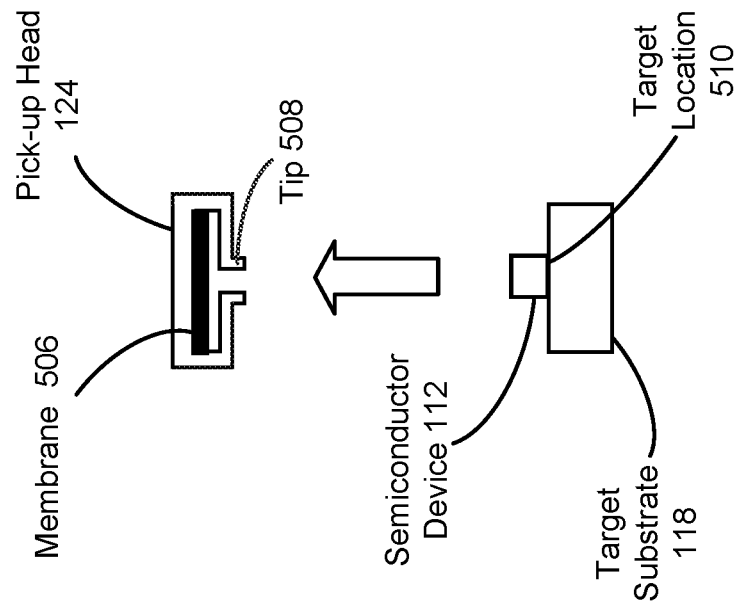
Figure 5D:
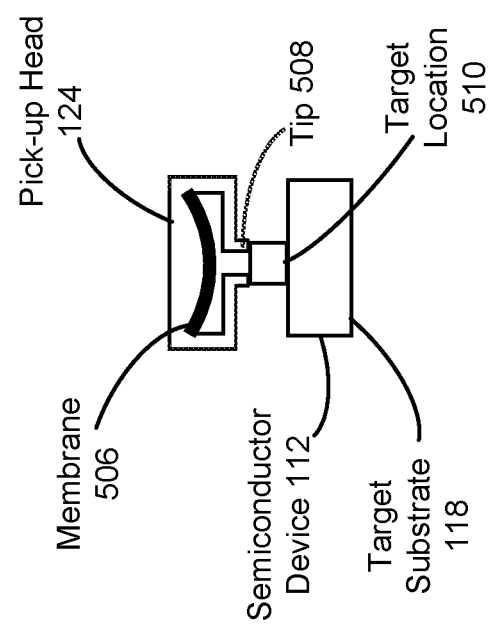

With reference to FIG. 5E, the pick-up head 124 is lifted away from the semiconductor device 112 placed on the target location 510 of the target substrate 118. The membrane 506 may be returned to the unbent or rest state for another pick and place process.

In some embodiments, if the target substrate 118 is a device substrate, a bonding process may be performed after placement of the semiconductor devices 112. The bonding processes attaches the semiconductor devices 112 to the target substrate 118, and may also be used to form the electronical contacts between the semiconductor devices 112 and the target substrate 118. The bonding process may include reflow of a low temperature solder alloy between the semiconductor devices 112 and the target substrate 118 such as tin-silver (SnAg) or copper-tin (CuSn).

The process 400 as illustrated in FIG. 4 is merely illustrative and various changes can be made to the process. For example, the process 400 may be repeated for different color LEDs to assemble a display device including sub-pixels formed from the different color LEDs. In each cycle, the pick-up head 104 may pick up a subset of LEDs from a carrier substrate 114 including LEDs of a single color, and place the subset of LEDs onto the target substrate 118.

Figure 6:
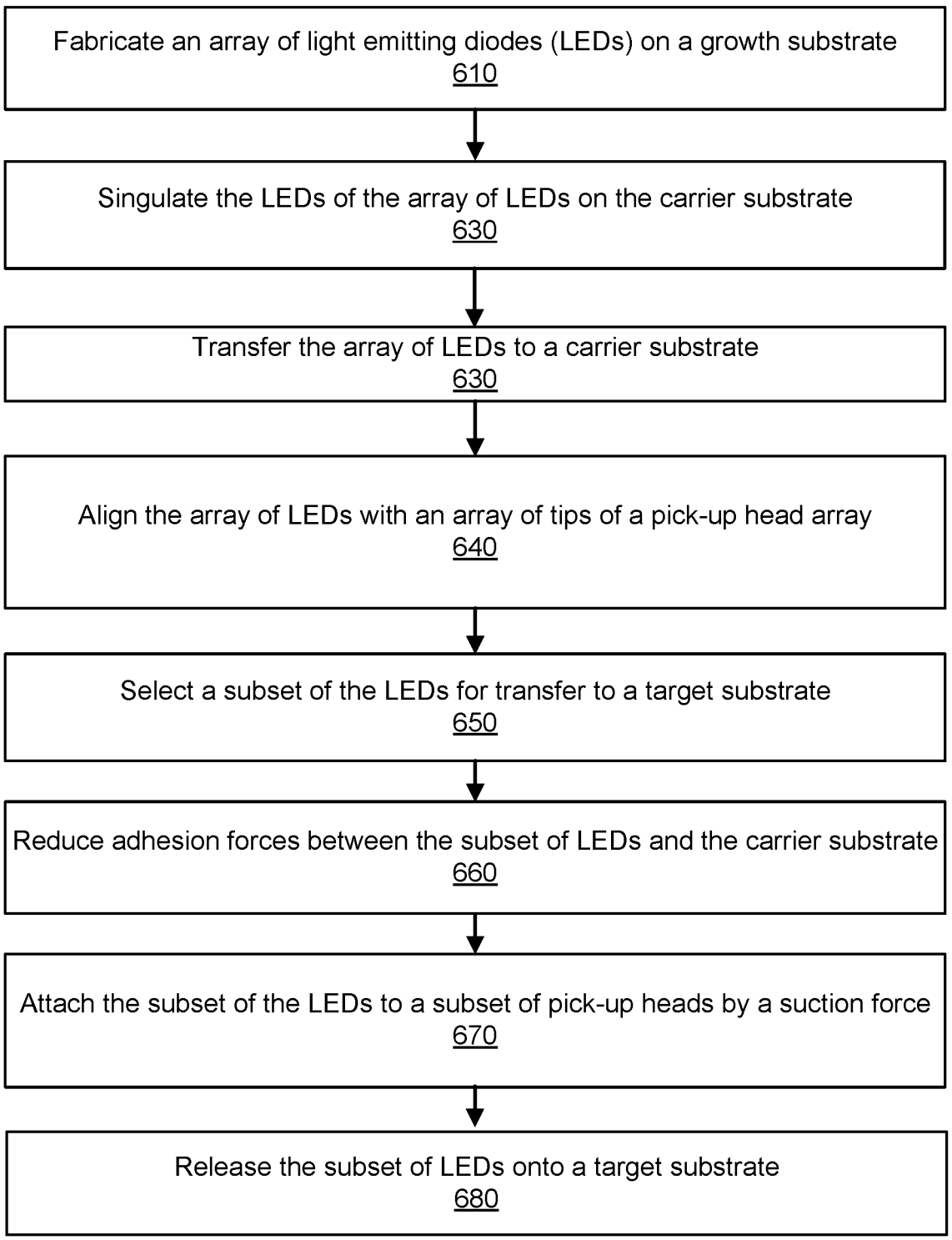
FIG. 6 is a flowchart illustrating a process for manufacturing an electronic display using a pick-up head array, in accordance with one embodiment.

FIG. 6 is a flowchart illustrating a process 600 for manufacturing an electronic display with a pick-up head array 104, in accordance with one embodiment. Process 600 can be performed by the system 100 to manufacture a display having a display substrate and LEDs coupled to the display substrate. In this example, the carrier substrate 114 is a carrier film, and the target substrate 118 is the display substrate. The semiconductor devices 112 are LEDs that are placed on the display substrate to form pixels. A pixel may include sub-pixels of individual different color LEDs. Process 600 is discussed with reference to FIGS. 7A, 7B, 7C, 7D, 7E, 7F, and 7G, showing schematic diagrams illustrating the manufacturing a display device with the pick-up head array 104, in accordance with one embodiment.

An array of LEDs are fabricated 610 on a native or growth substrate. The LEDs may include micro-LEDs. In some embodiments, the array of LEDs on the native substrate are fabricated such that they have a common structure and emit light of a common color. To assemble a display, multiple arrays of LEDs of different color (e.g., red, green, and blue) may be fabricated on separate native substrates. With reference to FIG. 7A, the semiconductor device wafer 702 includes an array of LEDs fabricated on the growth substrate 704.

The LEDs of the array of LEDs are singulated 620. Singulating the LEDs may include using a mechanical dicing process or a laser dicing process, such as an ablation dicing or stealth dicing process, or an etching process. The singulation separates the array of LEDs into individual LEDs that can be picked and placed onto the display substrate.

The array of LEDs are transferred 630 to a carrier substrate 114. With reference to FIG. 7B, the semiconductor device wafer 702 is separated into LEDs 706 on the growth substrate 704, and then placed on the carrier substrate 104. Furthermore, the growth substrate 704 is separated from the LEDs 706, such as using a laser-lift-off process. In some embodiments, the carrier substrate 114 includes a carrier film or other material that provides an adhesion force that bonds the semiconductor device wafer 702 to the carrier substrate 114.

The array of LEDs are aligned 640 with an array of tips 508 of pick-up heads 124 of the pick-up head array 104. With reference to FIG. 7C, the distance between adjacent LEDs 706 of the array are separated by a pitch P equal to the distance between adjacent pick-up heads 124 of the pick-up head array 104. Thus, the array of LEDs 706 on the carrier substrate 114 provides for efficient parallel pick up by the pick-up head array 104. Alternatively or additionally, the pick-up heads 124 of the pick-up head array 104 may be adjusted to conform to the pitch P of the LEDs on the carrier substrate 114.

In some embodiments, the LEDs are spatially separated in connection with the singulation. For example, stealth dicing may be performed using controlled wafer expansion to separate LEDs along dicing lines formed by a laser focused through an objective lens. In contrast, little or no wafer expansion can be used during mechanical dicing because of the controlled die separation caused by removal of material from the kerf (e.g., formed by a diamond based cutting wheel).

Returning to FIG. 6, a subset of the LEDs are selected 650 for transfer to the target substrate 118. For example, a group of LEDs may be selected for transfer to the display substrate to form sub-pixels for multiple pixels of the display. In some embodiments, the controller 106 selects one or more LEDs for transfer using the pick-up head array 104.

The pick-up head array 104 may access the one or more LEDs at any location of the carrier substrate. In some embodiments, a pre-program sequence could be used, alternatively an electronic wafer map may be stored and used by the controller 106. Depending on the selected pick-up heads 124, multiple semiconductor devices may be transferred concurrently in a variety of patterns (e.g. strips, wide spaced arrays, close packed arrays, etc.). In some embodiments, the plurality of semiconductor devices are selected from multiple sources, and then placed on the target substrate in a particular pattern. In some embodiments, the plurality of selected LEDs include functional die, and non-functional die are not selected for transfer. The functional die may be determined based on testing the semiconductor devices prior to the transfer.

The devices could be picked from one wafer source of from multiple wafer sources that could be closed packed on the final receiving substrate. Any and all functional die from the wafer surface could be harvested.

An adhesion force between the selected subset of LEDs and the carrier substrate 114 is reduced 660. As discussed above, the carrier substrate 114 may include a carrier tape. The carrier tape may be an adhesive layer that holds the individual LEDs in place subsequent to singulation. The adhesion force applied to the LEDs by the carrier substrate 114 may be reduced using a pre-release process to facilitate pick up with the pick-up head array 104.

In some embodiments, the pre-release process may include localized heating with a laser beam point beneath the semiconductor devices before the pick-up head array 104 is placed over or on the LEDs. Multiple LEDs can be accurately targeted using a calibrated diffraction element to target multiple locations, either linearly or in an ordered array. In some embodiments, the carrier substrate is cooled prior to start of the subsequent device pick-up. In some embodiments, a minimum beam size in the order of a few to 10's of μms can be used in the pre-release process, where the focal point is at the interface between the semiconductor device and the carrier tape. In some embodiments, the carrier tape, that would for example be transparent to the activation wavelength of the dicing laser, could have an adhesive layer that preferentially absorbs the laser energy, enabling a reduction in the tack of the tape in a localized area. In some embodiments, the carrier tape absorbs the laser applied through the carrier tape during the laser dicing process at 630 to cause a reduction in the adhesive force or tack of the adhesive layer in localized areas. In other embodiments, a plasma etch may be used in the pre-release process.

Identification of semiconductor device(s) to be pre-released from the carrier tape or substrate prior to pick up may be performed using an indexed reverse look-up camera (e.g., imaging device 108) with reference points within substrate material and an electronic wafer map. As such, the system 100 tracks semiconductor devices have already been transferred from a carrier substrate, and tracks target substrates that have been populated with the semiconductor devices.

The semiconductor device may be placed within a defined spatial pattern that may include fixed separation distances (e.g., the pitch P) or a close packing order. The spatial pattern may depend the features and pixel count of the display substrate. Semiconductor devices can be picked from one or more carrier substrates to generate the final assembly on the target display substrate. These semiconductor devices may be fabricated from separate (e.g., red, green and blue) native substrates, and placed on the display substrate according to the spatial pattern. The spatial pattern may be achieved using alignment techniques, such as mask aligners used during photolithographic processing of semiconductor wafers.

A subset of pick-up heads 124 of the pick-head array 104 attach 670 the subset of the LEDs to the subset of pick-up heads 124 by a suction force. The subset of pick-up heads 124 may be selected based on alignment with the selected subset of LEDs after the pick-up heads 124 are placed over or on the LEDs on the carrier substrate 114. With reference to FIG. 7D, the pick-up heads 124 are separated by the pitch P, and are brought toward the LEDs 706 to pick up the LEDs 706 separated by the pitch P from the carrier substrate 114 using the suction force.

Returning to FIG. 6, the subset of the pick-up heads 124 of the pick-up head array 104 releases 680 the subset of the LEDs onto the target substrate 118, which in this example is the display substrate. The target locations are locations of sub-pixels for multiple pixels of the display. The discussion of process 400 of FIG. 4 may be applicable at 670 and 680 of process 600.

Figure 7E:
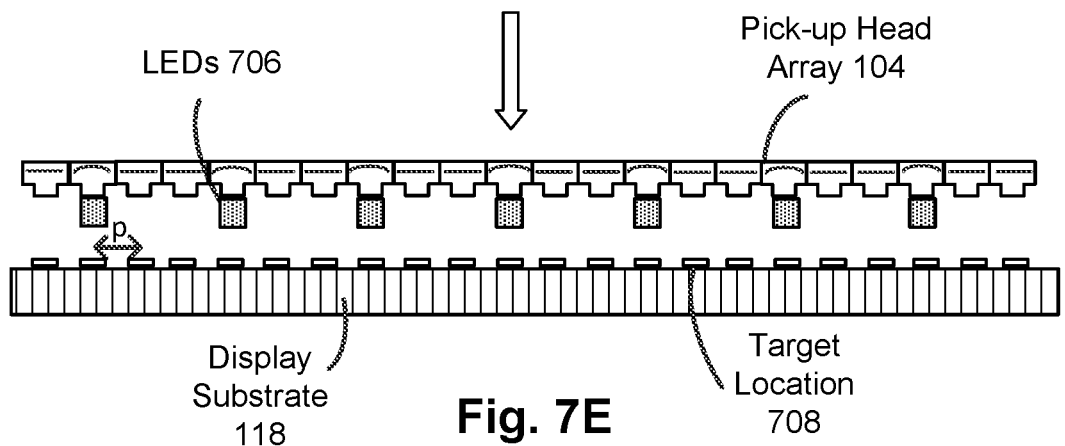
Figure 7F:
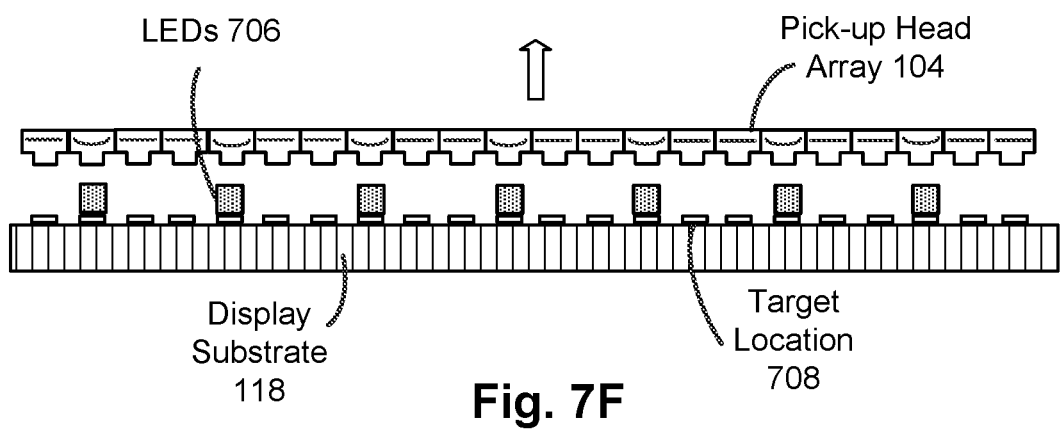

With reference to FIG. 7E, the pick-up head array 104 carries the attached LEDs 706 to the target display substrate 118 for placement at target locations 708 of the display substrate 118. In some embodiments, the target locations 708 include contact pads separated by the pitch P which form electrical contacts with contact pads on the LEDs 706. In other embodiments, the distance between the target locations 708 of the display substrate 118 may be different from the pitch P, and the pick-up array 104 adjusts the space between adjacent pick-up heads 124 according to the distance between the target locations 708. With reference to FIG. 7F, the pick-up head array 104 is separated from the display substrate 118 to place the LEDs 706 on the display substrate 118. In some embodiments, the display substrate 118 includes contact pads that bond with the contacts of the LEDs 706. The pick-up head array 104 may include a heating element that heats the LEDs 706 attached to the pick-up head array 104 to bond the contacts of the LEDs 706 to the contact pads of the display substrate 118. In some embodiments, the LEDs 706 are bonded to the display substrate 118 using a thermocompression (TC) bonding. The pick-up head array 104 may be configured to apply force to compress the LEDs 706 against the display substrate 118 while simultaneously applying heat.

Figure 7G:
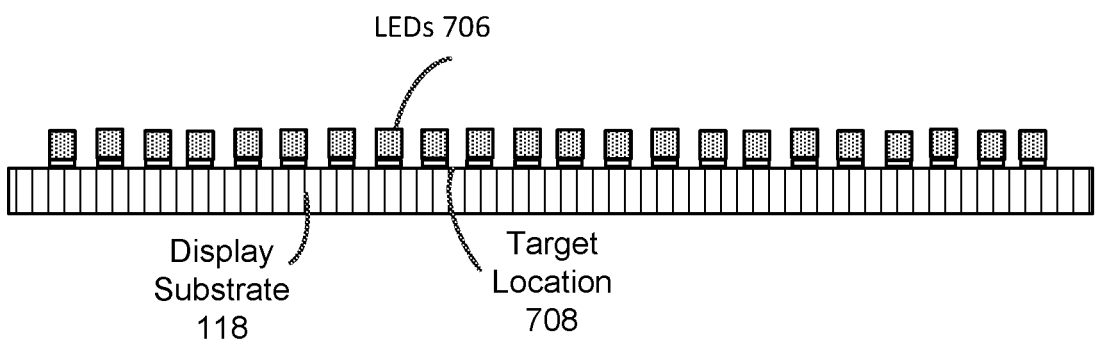

The process 600 as illustrated in FIG. 6 is merely illustrative and various changes can be made to the process. For example, the plurality of LEDs picked up at 670 may be placed on a plurality of different target substrates 118 at 680, rather than a single target substrate 118. In another example, process 600 can be repeated for semiconductor device wafers 702, where each semiconductor device wafer 702 has LEDs of different color. In each pick and place cycle, sub-pixels associated with a particular color may be placed on the display substrate, and multiple pick and place cycles with different types of LEDs can be used to manufacture each pixel of the electronic display. With reference to FIG. 7G, the display substrate 118 is populated with multiple LEDs 706 of different color on the display substrate 118 to form the sub-pixels of an electronic display.

Figure 8:
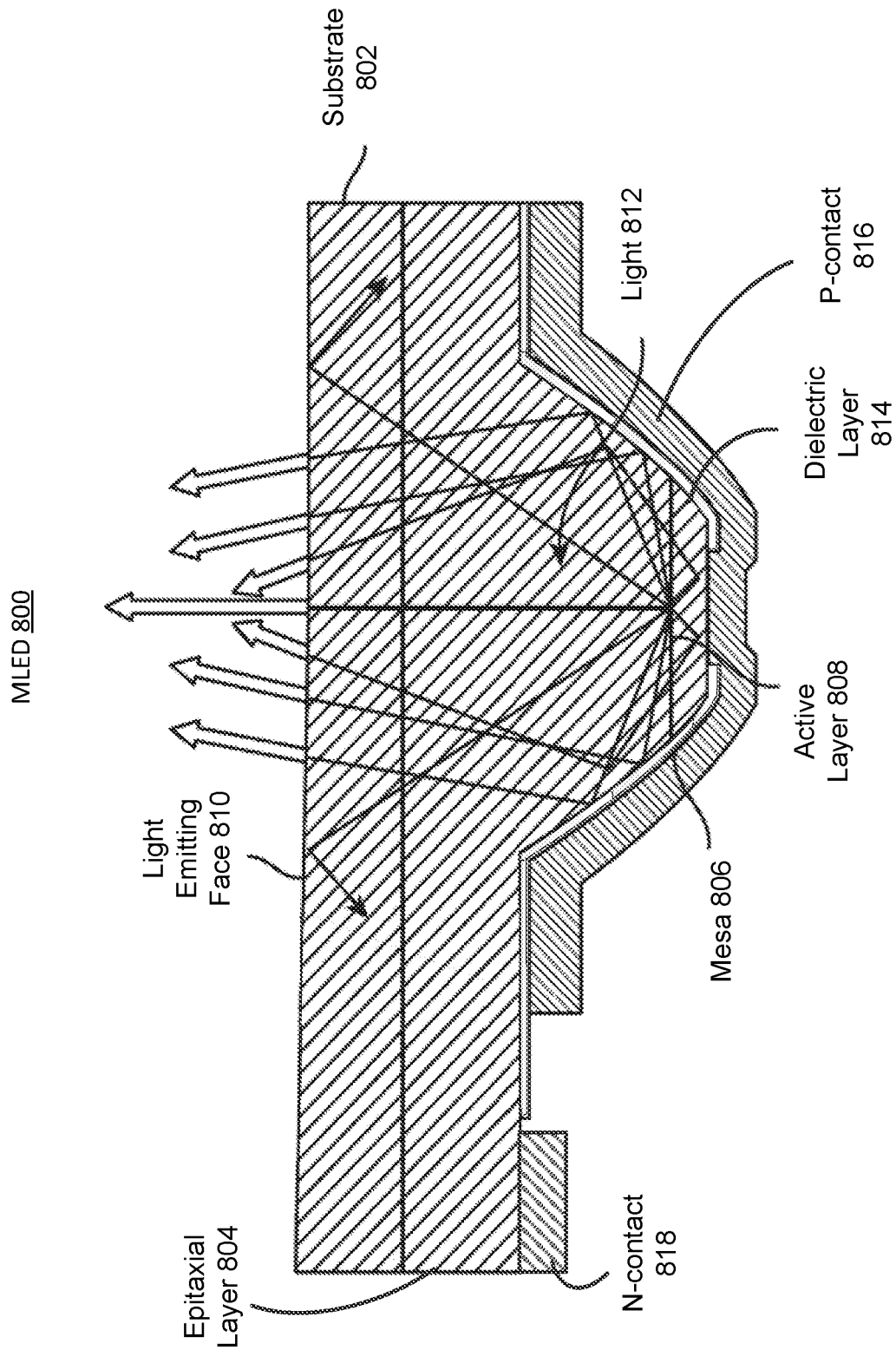
FIG. 8 is a schematic diagram illustrating a micro-LED, in accordance with one embodiment.

FIG. 8 is a schematic cross section of a micro-LED 800, in accordance with one embodiment. A "μLED," "MicroLED," or "mLED," described herein refers to a particular type of LED having a small active light emitting area (e.g., less than 2,000 μm$^2$), and may also produce collimated light output. The collimated light output increases the brightness level of light emitted from the small active light emitting area. The use of suction force to pick and place semiconductor device as discussed herein is not limited to the pick and place of micro-LEDs, and may be applicable to other types of light emitting devices. Furthermore, the micro-LED 800 is an only an example of a micro-LED that may be used, and other types of micro-LEDs such as those with different form factors or those that do not produce collimated light may also be used.

The mLED 800 may include, among other components, a LED substrate 802 (or "substrate 802") with a semiconductor epitaxial layer 804 disposed on the substrate 802, a dielectric layer 814 disposed on the epitaxial layer 804, a p-contact 816 disposed on the dielectric layer 814, and an n-contact 818 disposed on the epitaxial layer 804. The epitaxial layer 804 is shaped into a mesa 806. An active (or light emitting) layer 808 (or "active light emitting area") is included in the structure of the mesa 806. The mesa 806 has a truncated top, on a side opposed to a light transmitting or emitting face 810 of the mLED 800. The mesa 806 also has a near-parabolic shape to form a reflective enclosure for light generated within the mLED 800. The arrows 812 show how light emitted from the active layer 808 is reflected off the p-contact 816 and internal walls of the mesa 806 toward the light emitting face 810 at an angle sufficient for the light to escape the mLED device 800 (i.e., within an angle of total internal reflection). The p-contact 816 and the n-contact 818 connect the mLED 800 to the display substrate.

The parabolic shaped structure of the mLED 800 results in an increase in the extraction efficiency of the mLED 800 into low illumination angles when compared to unshaped or standard LEDs. Standard LED dies generally provide an emission full width half maximum (FWHM) angle of 120°. This is dictated by the Lambertian reflectance from a diffuse surface. In comparison the mLED 800 can be designed to provide controlled emission angle FWHM of less than standard LED dies, such as around 60°. This increased efficiency and collimated output of the mLED 800 can produce light visible to the human eye with only nano-amps of drive current.

The mLED 800 may include an active light emitting area that is less than standard inorganic LEDs (ILEDs), such as less than 2,000 μm$^2$. The mLED 800 directionalizes the light output from the active light emitting area and increases the brightness level of the light output. The mLED 800 may be less than 50 μm in diameter with a parabolic structure (or a similar structure) etched directly onto the LED die during the wafer processing steps to form a quasi-collimated light beam emerging from the light emitting face 810.

As used herein, "directionalized light" includes collimated and quasi-collimated light. For example, directionalized light may be light that is emitted from a light generating region of a LED and at least a portion of the emitted light is directed into a beam having a half angle. This may increase the brightness of the LED in the direction of the beam of light.

The mLED 800 may include a circular cross section when cut along a horizontal plane as shown in FIG. 8. A mLED 800 may have a parabolic structure etched directly onto the LED die during the wafer processing steps. The parabolic structure may comprise a light emitting region of the mLED 800 and reflects a portion of the generated light to form the quasi-collimated light beam emitted from the light emitting face 810.

The substrate 802 may be a growth substrate on which the epitaxial layer 804 is formed. In some embodiments, the substrate 802 is separated from the epitaxial layer 804, such as using a LLO process. In other embodiments, such as when the substrate 802 is transparent for the light 812 emitted by the mLED 800, the substrate 802 is not separated from the epitaxial layer 804.

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A method, comprising:
placing an array of pick-up heads over or on semiconductor devices on a carrier substrate;
receiving electrical signals at a subset of pick-up heads to actuate membranes in the subset of pick-up heads to place vacuum chambers of the subset of pick-up head at a pressure that is lower than ambient pressure to cause a suction force that attaches a subset of the semiconductor devices to apertures of the subset of pick-up heads connected to the vacuum chambers;
placing at least the subset of pick-up heads with the subset of semiconductor devices attached over or on a target substrate; and
releasing the subset of the semiconductor devices onto the target substrate responsive to placing the at least the subset of pick-up heads over or on the target substrate.

2. The method of claim 1, further comprising:
aligning, with the pick-up head, the semiconductor device with a location on the target substrate before releasing the subset of the semiconductor devices.

3. The method of claim 2, wherein:
the target substrate is a display substrate; and
the semiconductor devices are micro light emitting diodes (mLEDs).

4. The method of claim 1, wherein each of the apertures has an area of at least 1 μm².

5. The method of claim 1, wherein each of the semiconductor devices comprises an elastomeric layer on a surface facing the pick-up heads for attaching to the pick-up heads.

6. The method of claim 1, wherein each of the pick-up heads comprises a conformable tip onto which a corresponding semiconductor device attaches.

7. The method of claim 6, wherein the conformable tip defines an aperture having an area of at least 100 nm².

8. The method of claim 1, wherein the membranes include piezo benders.

9. A fabrication system, comprising:
   an array of pick-up heads having apertures and selectively operated to:
      attach a subset of semiconductor devices on a carrier substrate onto the operated pick-up heads by a suction force provide via the apertures, and
      detach the subset of the semiconductor devices onto a target substrate by releasing the subset of the semiconductor devices from the array of pick-up heads, wherein each of the pick-up heads comprises:
      a frame defining a vacuum chamber;
      a membrane actuated using an electrical signal to create a pressure in the vacuum chamber lower than an ambient pressure to cause the suction force; and
      a tip defining the aperture connected to the vacuum chamber to pick up a semiconductor device by the suction force; and
   an actuator coupled to the array of pick-up heads and configured to:
      place the array of pick-up heads over or on the semiconductor devices on the carrier substrate, and
      place at least the subset of pick-up heads with the subset of semiconductor devices attached over or on the target substrate.

10. The fabrication system of claim 9, wherein the membrane is a piezoelectric bender.

11. The fabrication system of claim 9, wherein the aperture has an area of at least 1 μm².

12. The fabrication system of claim 9, wherein each of the semiconductor devices comprises an elastomeric layer on a surface facing the pick-up heads for attaching to the pick-up heads.

13. The fabrication system of claim 9, wherein the tip of each of the pick-up heads comprises a conformable tip onto which a corresponding semiconductor device attaches.

14. The fabrication system of claim 13, wherein the conformable tip defines an aperture an area of at least 100 nm².

15. The fabrication system of claim 9, wherein:
   the target substrate is a display substrate; and
   the semiconductor devices are micro light emitting diodes (mLEDs).

16. An electronic display fabricated by a method, comprising:
   placing an array of pick-up heads over or on semiconductor devices on a carrier substrate;
   receiving electrical signals at a subset of pick-up heads to actuate membranes in the subset of pick-up heads to place vacuum chambers of the subset of pick-up heads at a pressure that is lower than ambient pressure to cause a suction force that attaches a subset of the semiconductor devices to apertures of the subset of pick-up heads connected to the vacuum chambers;
   placing at least the subset of pick-up heads with the subset of semiconductor devices attached over or on a display substrate; and
   releasing the subset of the semiconductor devices onto the display substrate responsive to placing the at least the subset of pick-up heads over or on the display substrate.

17. The electronic display of claim 16, wherein the membranes include piezoelectric benders.

\* \* \* \* \*